United States Patent
Ding et al.

(10) Patent No.: US 11,832,428 B2
(45) Date of Patent: Nov. 28, 2023

(54) BATTERY WITH ELECTROMAGNETIC INTERFERENCE SHIELDING

(71) Applicant: Google LLC, Mountain View, CA (US)

(72) Inventors: Yao Ding, San Jose, CA (US); Troy Edwards, Los Gatos, CA (US); Gemin Li, Pleasanton, CA (US)

(73) Assignee: Google LLC, Mountain View, CA (US)

( * ) Notice: Subject to any disclaimer, the term of this patent is extended or adjusted under 35 U.S.C. 154(b) by 203 days.

(21) Appl. No.: 17/379,421

(22) Filed: Jul. 19, 2021

(65) Prior Publication Data

US 2023/0014566 A1    Jan. 19, 2023

(51) Int. Cl.
*H05K 9/00* (2006.01)

(52) U.S. Cl.
CPC ......... *H05K 9/0024* (2013.01); *H05K 9/0081* (2013.01)

(58) Field of Classification Search
CPC .. H05K 9/0024; H05K 9/0081; H04R 1/1058; H04R 1/1091; H04R 1/1025; H04R 1/1016; H01M 10/425
See application file for complete search history.

(56) References Cited

U.S. PATENT DOCUMENTS

| | | | | |
|---|---|---|---|---|
| 6,389,143 | B1 * | 5/2002 | Leedom | H04R 25/60 381/328 |
| 7,003,127 | B1 * | 2/2006 | Sjursen | H04R 25/65 381/328 |
| 2004/0081328 | A1 * | 4/2004 | Leedom | H04R 25/602 381/323 |
| 2007/0001777 | A1 | 8/2007 | Sjursen et al. | |
| 2007/0177749 | A1 * | 8/2007 | Sjursen | H04R 25/602 381/322 |
| 2009/0003177 | A1 | 12/2009 | Kwag et al. | |
| 2009/0317703 | A1 | 12/2009 | Kwag et al. | |
| 2011/0000145 | A1 | 1/2011 | Boda et al. | |
| 2011/0014515 | A1 | 1/2011 | Boda et al. | |

FOREIGN PATENT DOCUMENTS

| | | | |
|---|---|---|---|
| CN | 212257611 U | * | 12/2020 |
| JP | 2008108468 | | 5/2008 |
| JP | 2008108468 A | | 5/2008 |

* cited by examiner

*Primary Examiner* — James Wu
*Assistant Examiner* — Christopher L Augustin
(74) *Attorney, Agent, or Firm* — Colby Nipper PLLC

(57) ABSTRACT

A wearable audio device sized to fit within an ear of an user comprises an outer housing; a circuit board positioned within the outer housing; a battery having an anode and a cathode, the battery being connected to the circuit board; a speaker adjacent the battery; and an electromagnetic interference ("EMI") shield tab coupled to the anode. The EMI shield tab may be configured to shield the speaker from EMI generated by the circuit board and to provide an electrical interconnection to the anode. The EMI shield tab may be comprised of a high magnetic flux permeable metal material

19 Claims, 5 Drawing Sheets

BATTERY WITH ELECTROMAGNETIC INTERFERENCE SHIELDING

BACKGROUND

Wearable devices are electronic devices that are designed to be worn by users for extended periods of time. These compact devices include multiple components that are required for the wearable device to function. At a minimum, such devices commonly require main logic boards and batteries having sufficient capacity to provide power to the wearable device for hours or days. The capacity of a battery is usually commensurate with the size of the battery, with batteries having more capacity being larger and heavier than batteries with less capacity.

Wearable audio devices sized to fit within the ear of a user must further contend with noise generated by components of the wearable audio device. For example, the magnetic flux generated by the main logic board of the wearable audio device can create noise that interferes with the quality of the sound produced through the speakers of the wearable audio device, and diminishes the user's overall experience.

BRIEF SUMMARY

According to an aspect of the disclosure, a wearable audio device sized to fit within an ear of an user comprises an outer housing; a circuit board positioned within the outer housing; a battery connected to the circuit board that has an anode and a cathode; a speaker adjacent the battery; and an electromagnetic interference ("EMI") shield tab coupled to the anode. The EMI shield tab may be configured to shield the speaker from EMI generated by the circuit board and to provide an electrical interconnection to the anode. The EMI shield tab may be comprised of a high magnetic flux permeable metal material According to another aspect of the disclosure, a wearable audio device sized to fit within an ear of an user comprises an outer housing; a circuit board positioned within the outer housing; a battery electrically connected to the circuit board; an EMI shield tab attached to the battery; and, an electronic component coupled to the circuit board. The EMI shield tab may be comprised of a MuMetal and have an opening that extends therethrough. The EMI shield tab may be configured to shield the electronic component from EMI generated by the circuit board and to provide an electrical interconnection to the battery. The battery, the EMI shield tab, and the electronic component may be further positioned within the outer housing.

According to another aspect of the disclosure, a subassembly comprises a battery having an anode and a cathode; an EMI shield tab attached to the anode; and a cathode battery tab coupled to the cathode. The EMI shield tab may be comprised of a high magnetic flux permeable material, such as a metal or alloy. The EMI shield tab may be further configured to provide an electrical connection between the anode and a device external to the subassembly.

DETAILED DESCRIPTION

Overview

The compact size of wearable devices, such as wearable audio devices, provides little space to implement structural components that can effectively diminish noise generated by components within the device. To address these shortcomings, an electromagnetic interference ("EMI") shield coupled to the battery can be implemented within the device. In one example, the EMI shield may be in the form of an EMI shield tab that is directly attached to the battery. The EMI shield tab may be formed from a magnetic flux permeable material, such as a MuMetal, that may range in thickness from at least 20 μm to 2000 μm. The EMI shield tab may provide EMI shielding from noise generated by adjacent components, and in some examples, further provides an electrical connection between the battery and another component. The EMI shield tab can additionally provide structural support for other components positioned adjacent to the EMI shield tab.

Example EMI Shield Tab

Figure 1:
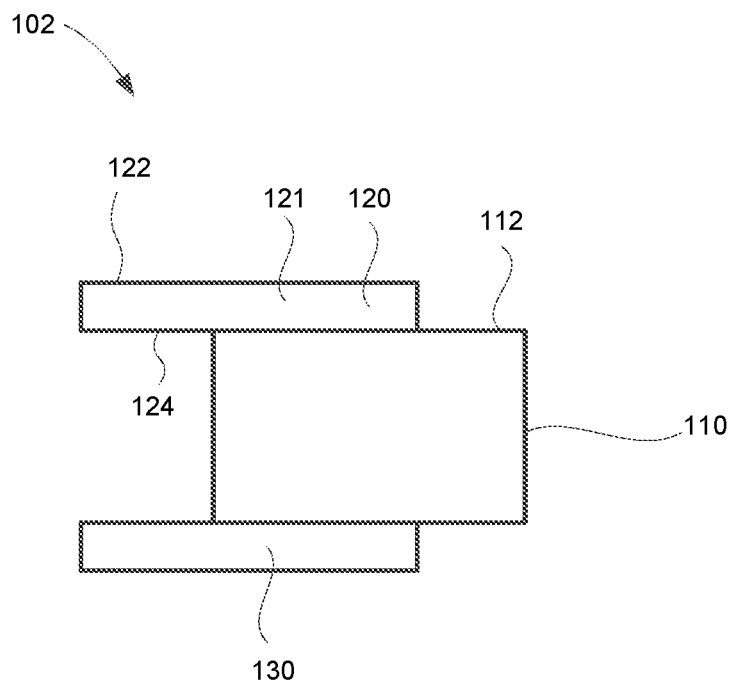
FIG. 1 is a cross-sectional schematic view of an example of an example battery and EMI shield tab according to an aspect of the disclosure.
Figure 2:
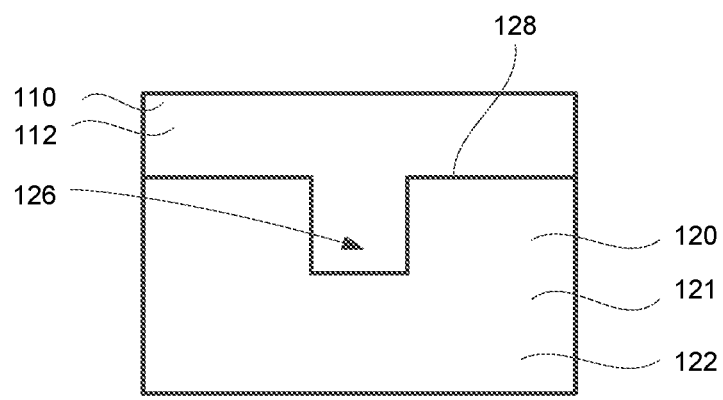
FIG. 2 is a schematic top view of FIG. 1.

According to aspects of the disclosure, FIG. 1 illustrates a schematic side view of a subassembly 102 that can be incorporated into an electronic device and that includes a battery 110 coupled to an EMI shield, which in this example is an EMI shield tab 120 that can provide electromagnetic interference shielding. In some examples, the battery may be a lithium-ion battery that is capable of being charged and discharged by lithium ions that move between the negative (anode) and positive (cathode) electrodes. Lithium ion batteries store high-capacity power and can be used across a wide range of applications, including consumer electronics, such as mobile phones, wearable devices, personal computers and the like.

An EMI shield may be in the form of example EMI shield tab 120 and may be coupled to the battery 110. In this example, the EMI shield tab is directly attached to battery 110. The EMI shield tab 120 may be attached to the battery 110 using conventional means, such as welding or a mechanical fastener. As shown, the EMI shield tab 120 is elongated and extends over a portion of the top surface 112 of the battery 110. The EMI shield tab 120 can include at least one opening 126 through which the top surface 112 of the battery 110 is exposed.

In some examples, the EMI shield tab may be comprised of a ferrous material or alloy, such as steel, nickel, steel-nickel alloy and the like that has a high magnetic flux or a high relative magnetic flux permeability. "Relative permeability" $\mu_r$ is defined as the ratio $\mu/\mu_0$, which is dimensionless. Magnetic permeability p is defined as $\mu=B/H$. "B" is magnetic flux density and measures the actual magnetic field within a material considered as a concentration of magnetic field lines, or flux, per unit cross-sectional area. "H" is magnetic field strength and measures the magnetizing field produced by electric current flow through a coil of wire. The magnetic constant is $\mu_0=4\pi\times10^{-7}$ T m/A. Ferrous or ferromagnetic materials have a permeability that is large and such materials are characterized by a relative permeability and assigned a relative permeability value.

MuMetal is one example of a ferromagnetic alloy of nickel and iron that has high magnetic flux permeability. The relative permeability of MuMetal allows for effective containing of magnetic fields, which cannot be attenuated by other methods. This can be useful to shield components behind the MuMetal, such as other electronic components that may be positioned within a housing behind the EMI shield tab. MuMetal typically has a relative permeability value ranging from 80,000-100,000 compared to several thousand for ordinary steel. The high relative permeability of MuMetal provides a low reluctance path for magnetic flux, thereby providing a path for the magnetic field lines around the shielded area.

In other examples, the EMI shield tab 120 may be comprised of other ferrous materials or ferrous alloy, such as silicon steel. Such materials or alloys can have a relative permeability value ranging from 1000 to 300,(XX). In still other examples, the relative permeability value may be more or less than 1000, or more than 300,000. The EMI shield tab may also be comprised of multiple layers of the same or different ferrous material or alloys to increase the EMI shielding capability of the EMI shield tab 120.

The EMI shield 120 is shown as a generally continuous planar metal sheet with a main body 121. In some examples, the EMI shield tab 120 can include an opening 126 within the main body 121 that extends between the top surface 122 and bottom surface 124 of the EMI shield main body 121. As shown the opening 126 extends from adjacent the outer peripheral edge 128 of the EMI shield tab 120 to an interior portion of the EMI shield tab. This allows for an entrance to the opening 126 adjacent the outer edge of the EMI shield tab 120. Additionally or alternatively, the opening 126 may be an opening that has a circumferential edge defined by the EMI shield main body 121 and that does not include an entrance to the opening adjacent the outer edge of the EMI shield tab 120. The opening 126 can allow for swelling of the battery, which may result from a build-up of heat and gas caused by overcharging, manufacturer defect, deep discharge, or other damage to the battery. In still other examples, the EMI shield may not include an opening.

While EMI shields commonly require fully enclosing a component to fully shield or contain electromagnetic fields, EMI shield tabs according to aspects of the disclosure may overlie only one surface of a component. For example, the EMI shield tab 120 may overlie only the top surface 112 of the battery 110, although the EMI shield tab 120 may also overlie more than one surface, such as more than one surface, such as two or three surfaces.

The EMI shield tab 120 can be manufactured to have any shape, size, or form. In some examples, the EMI shield tab may be circular, triangular, include rounded edges or uneven edges or any other shape. Similarly, EMI shield tab 120 may be in the form of elongated metal strips, metal screens, metal wires, or metal foams to name a few examples. The EMI shield is referred to in this example as an EMI shield tab, but it is to be appreciated that the shape and size of the EMI shield tab is not limited to the example shapes and sizes disclosed herein or to any specific tab configuration.

The thickness of the EMI shield tab 120 can further improve the effectiveness of the EMI shield tab 120 at shielding or containing magnetic flux. In some examples, the thickness of the EMI shield tab 120 may be 100 microns. In other examples, the thickness of the EMI shield tab 120 may range from at least 20 µm to 2000 µm. In still other examples the thickness of the EMI shield tab 120 may be less than 50 µm, less than 20 µm or greater than 1,000 µm or greater than 2000 microns.

In this example, although not required, the EMI shield tab 120 can also function as an electrical interconnection between the battery 110 and a component external to the battery 110. Battery 110 includes an anode (not shown) and a cathode (not shown). Battery tabs are commonly attached to batteries to provide an electrical interconnection between the anode and cathode of the battery to another device. Although not required, EMI shield tab 120 can be additionally used to provide an electrical interconnection to one of the battery nodes. In some examples, the EMI shield tab 120 can further function as an anode tab that is attached to the anode. The conductive properties of the material forming the EMI shield tab 120, such as the MuMetal, allow for electrical interconnection between the battery node and an external device. Use of the EMI shield tab 120 can therefore eliminate the need for a separate battery tab to provide an electrical interconnection with another component, which will thereby save on space when the battery and EMI shield are coupled together and incorporated into a device. Further, in the example where the EMI shield tab provides an electrical interconnection to the anode, a battery tab 130 can optionally be used to provide an electrical interconnection to the cathode of the battery 110. In other examples, EMI shield tab may instead be connected to the cathode and battery tab 130 is attached to the anode. In still other examples, as described below, the EMI shield tab does not provide the primarily electrical interconnection from the battery 110, such that the subassembly further includes a first tab attached to a node of the battery 110, a second battery tab (battery tab 130) attached to the other node of the battery 110, and the EMI shield tab coupled to the battery 110.

Figure 3:
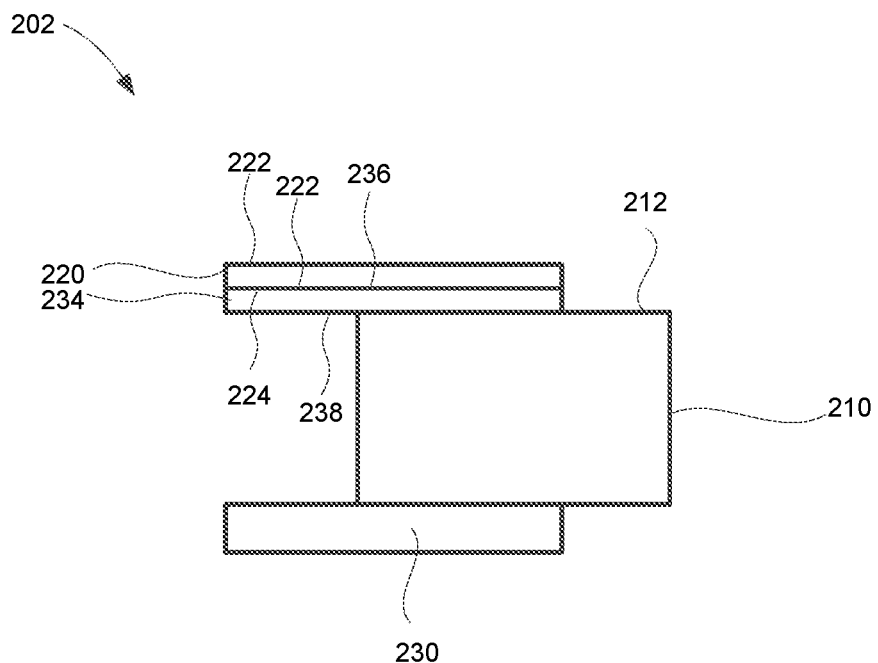
FIG. 3 is a cross-sectional schematic view of an example of an example battery and EMI shield tab according to an aspect of the disclosure.

FIG. 3 illustrates an example of another example subassembly 202 for an electronic device showing an EMI shield tab coupled to a battery. As shown, two independent battery tabs, as well as an EMI shield tab are provided. First battery tab 234 and a second battery tab 230 are shown directly attached to battery 210. The first and second battery tabs 234, 230 may be configured as commonly known battery tabs that are used to provide an electrical or conductive interconnection between the nodes of the battery 210 and an external device. The first and second battery tabs 234, 230 may be formed from conventional metal, such as stainless steel. In this example, the first battery tab 234 may be an anode tab and the second battery tab 230 may be a cathode tab, but the reverse may be true in other examples. Although not required, in this example, first battery tab 234 includes an opening (not shown) extending through the top surface 236 and bottom surface 238 of the first battery tab 234. The top surface 212 of the battery will be visible through the opening in the first battery tab 234.

Figure 4:
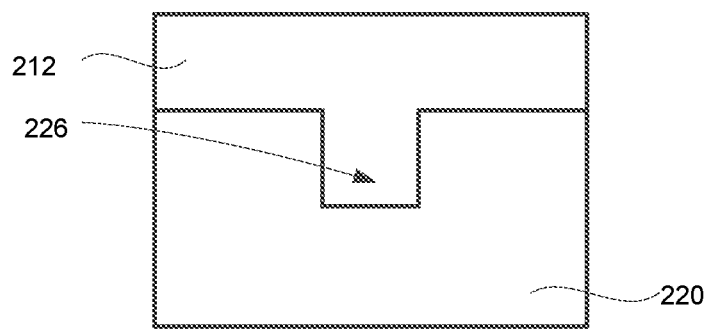
FIG. 4 is a schematic top view of FIG. 3.

The EMI shield tab 220 may be directly attached to the first battery tab 234. The EMI shield tab 220 is shown here as a generally continuous planar metal sheet and in some examples can include an opening 226 that extends through the top surface 222 and bottom surface 224 of the EMI shield tab 220 and is further aligned with the opening of the first battery tab 234. As shown in the top view of FIG. 4, the top surface 212 of the battery 210 will be exposed or visible through the opening 226 of the EMI shield tab 220, as well as the opening in the first battery tab 234. But, in other examples, the openings may be aligned or only the EMI shield tab 220 may include an opening. The EMI shield tab 220 may take on the same shape and size of the first battery tab 234, such that the first battery tab 234 is not visible in the top view of FIG. 4. In other examples, the EMI shield tab 220 may be comprised of multiple smaller tabs or sized or shaped differently than the first battery tab 234 or any shape or form discussed herein. In other examples, the EMI shield tab 220 may be positioned away from the first battery tab 234 or only partially overlying the first battery tab.

As in the previous examples, the EMI shield tab 220 may be formed from a high magnetic flux permeable material or alloy, such as a ferrous metal or alloy. MuMetal or any of the materials or alternatives previously discussed can comprise the EMI shield tab 220. Further, the EMI shield tab 220 may have a thickness of 100 μm or a thickness greater than 20 μm. In other examples, the thickness of the EMI shield tab 220 may vary, including having the thicknesses previously disclosed, such as thicknesses ranging from 20 μm to 2000 μm, as previously discussed.

Figure 5:
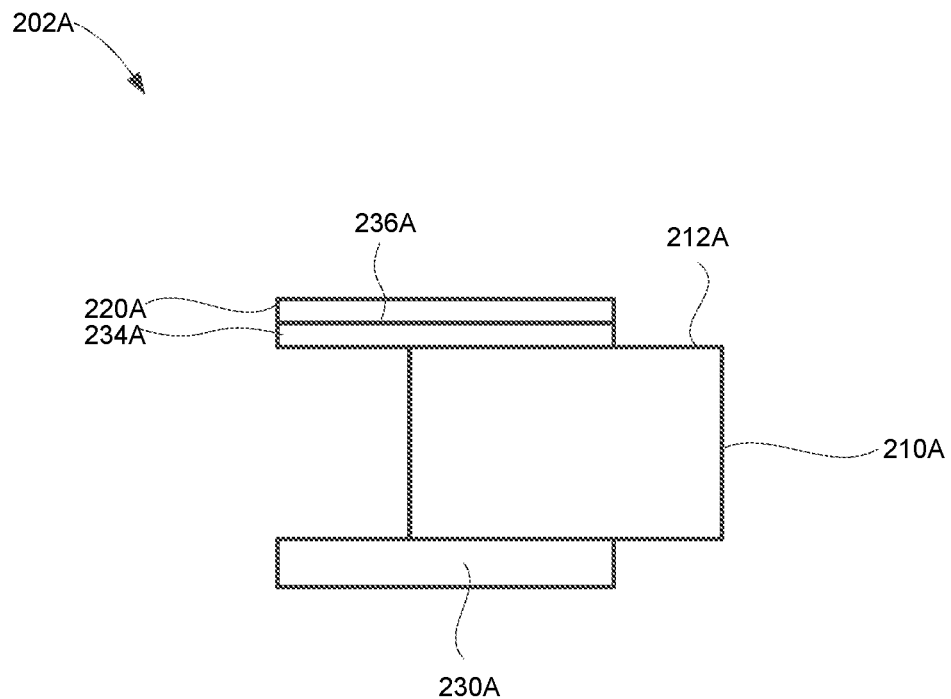
FIG. 5 is a cross-sectional schematic view of an example of an example battery and EMI shield tab according to an aspect of the disclosure.
Figure 6:
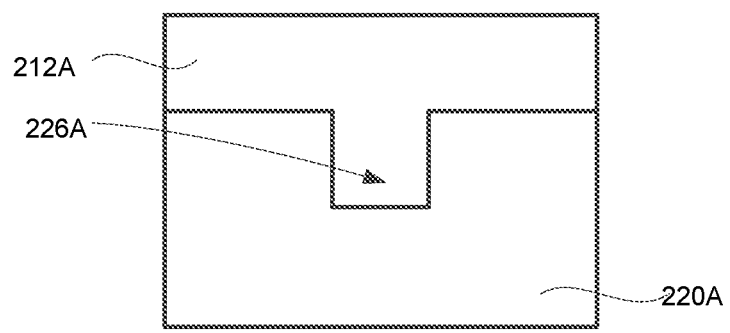
FIG. 6 is a schematic top view of FIG. 5.

FIGS. 5 and 6 illustrate another example subassembly 202A for an electronic device that comprises an EMI shield tab coupled to a battery. This example is similar to FIG. 3, except that the EMI shield tab is in the form of a metal coating. As shown, a first battery tab 234A and a second battery tab 230A are attached to the nodes of battery 210A. The first and second battery tabs 234A, 230 may be formed from various metals, including, without limitation, conventional stainless steel. In this example, EMI shield tab 220A is a metal coating that is provided directly onto the first battery tab 234A. Use of an EMI shield tab 220A coated onto the first battery tab 234A eliminates the need to attach a structurally separate or independent EMI shield tab to the first battery tab 234A.

The EMI shield tab 220A may overlie and cover the entire top surface 236A of the first battery tab 234A. As shown, as a result, the EMI shield tab 220A can further include an opening 226A that is aligned with the opening of the first battery tab 234, to allow for battery swelling. The top surface 212A of the battery 210A will be exposed or visible through the opening 226A of the EMI shield tab 220A, as well as the opening in the first battery tab 234A. The coating may be comprised of a highly magnetic flux permeable metal material, such as MuMetal. The relative permeability value of the coating may range from 1000-300,000. In other examples, the relative permeability value of the coating may be less than 1000 or greater than 300,000.

The thickness of the coating forming the EMI shield tab 220A can further improve the effectiveness of the EMI shield tab 220A at shielding magnetic flux. In some examples, the thickness of the coating forming the EMI shield tab 220A may be 100 μm. In other examples, the thickness of the coating forming the EMI shield tab 220A may range from 20 μm to 2000 μm. In still other examples the thickness of the coating forming the EMI shield tab 220A may be less than 20 μm, greater than 20 μm, or greater than 2000 μm.

Any method or combinations of methods of depositing or providing the metal coating onto the first battery tab 234A may be used. In one example, thermal spraying techniques may be used to coat the material forming the EMI shield tab 220A directly onto the first battery tab 234A. The thermal spraying coating process sprays heated or melted materials, which may be in the form of finely divided molten or semi-molten droplets, directly onto a surface, such as the first battery tab. Thermal spraying allows for deposition of thick coatings that may range from as little as 20 microns to several millimeters. Other methods may also be used, such as, but not limited to electroplating or physical and chemical vapor deposition. The thermal spraying or desired method of depositing the metal coating onto the first battery tab 234A may take place prior to the attachment of the first battery tab 234A to the battery 210A.

Example Wearable Device with EMI Shield Tab

Figure 7:
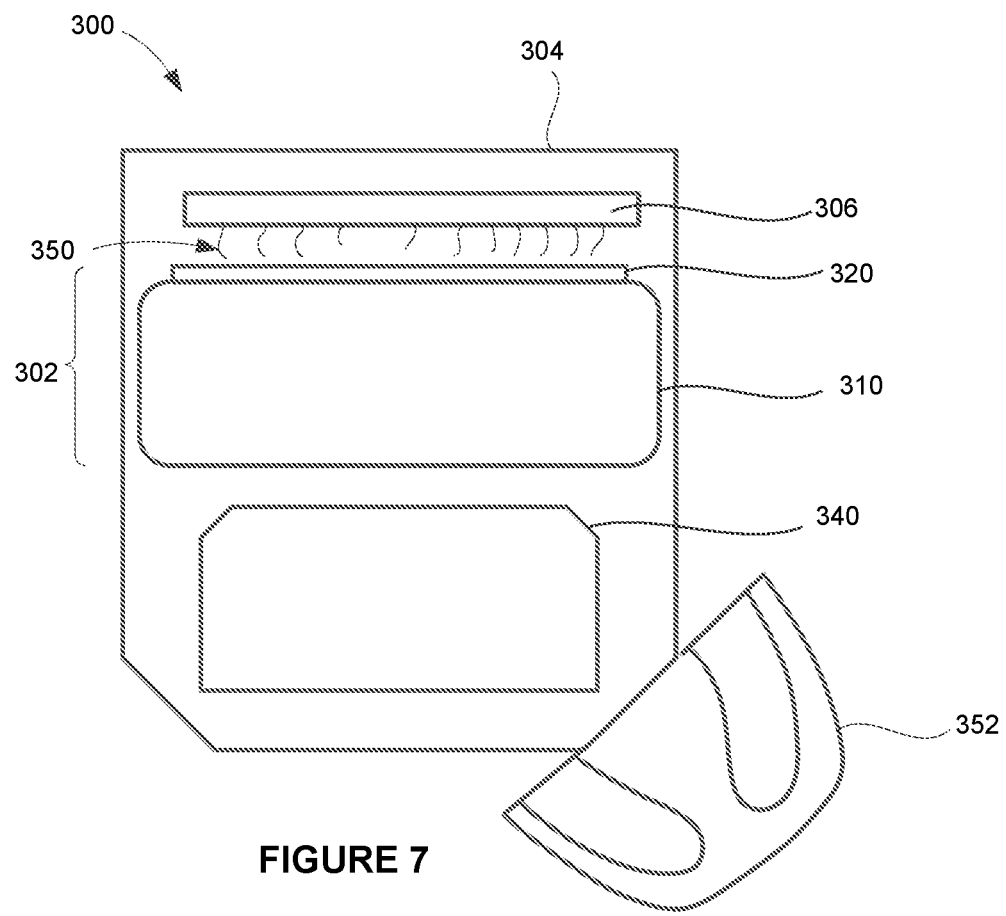
FIG. 7 is an enlarged view of the example battery and EMI shield tab of FIG. 5 according to an aspect of the disclosure.

FIG. 7 illustrates a schematic cross-sectional view of an example of an electronic device that can implement a subassembly comprising at least an EMI shield coupled to a battery. In this example, the electronic device is a wearable audio device 300. In one example, the wearable audio device 300 may be an earbud or earphone that is sized to be positioned within the ear of a user. The wearable audio device 300 can include an outer housing 304, a circuit board or main logic board ("MLB") 306, a speaker 340, an earbud tip 352, and a subassembly 302, as previously discussed herein, that comprises a battery 310 and an EMI shield, such as EMI shield tab 320. Battery 310 and EMI shield tab 320 may have features respectively similar to the batteries and EMI shield tabs previously disclosed. A flex circuit (not shown) along with numerous other components required for the wearable audio device to function are omitted from the figure and description for ease of discussion and illustration, and for being outside the scope of the present disclosure.

The MLB generates an electromagnetic field (schematically represented by reference element 350) that creates noise capable of interfering with the speaker and audio heard by a user, if uninterrupted. To minimize MLB noise, an EMI shield can be provided between the MLB 306 and speaker 340. In this example, EMI shield tab 320 is provided between MLB 306 and battery 310, but in other examples, the EMI shield tab 320 may be located between battery 310 and speaker 340. As shown, EMI shield tab 320 extends across significant portions of the top surface 312 of battery 310.

Figure 8:
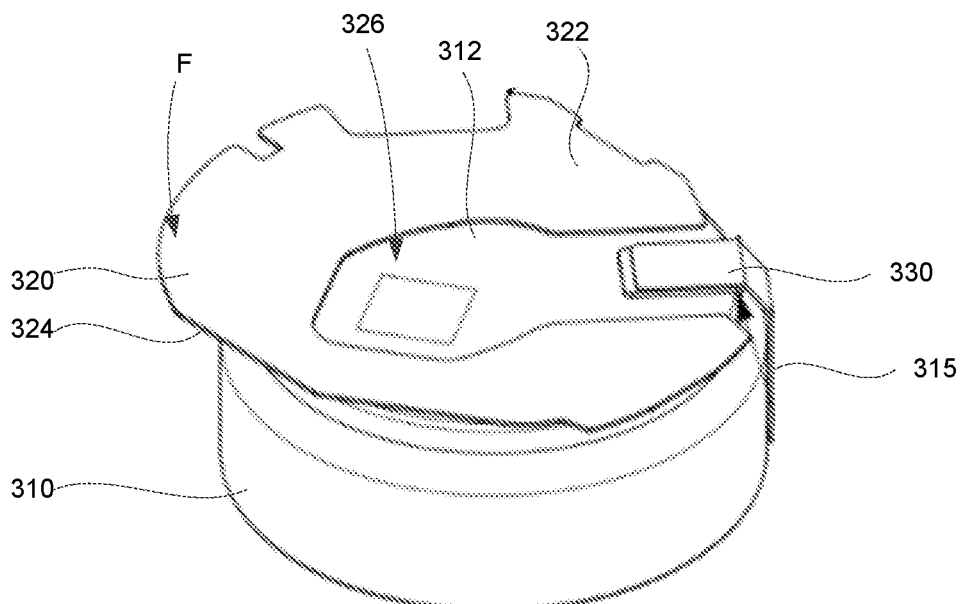
FIG. 8 is a is a schematic top view of FIG. 5.

FIG. 8 illustrates an enlarged view of an example battery 310 and EMI shield tab 320. EMI shield tab 320 can be a metal sheet that is attached to the top surface 312 of the battery 310. EMI shield tab 320 includes a top surface 322 and a bottom surface 324. EMI shield tab 320 can be oriented so that the top surface 322 faces toward the MLB 306 and the bottom surface 324 faces toward the top surface 312 of the battery 310. The bottom surface of EMI shield tab 320 may be welded to battery 310 to secure the EMI shield tab 320 to the battery 310, but other methods or structure may be used to secure the EMI shield tab 320 to the battery 310.

While the shape of the EMI shield tab 320 can take on many configurations, EMI shield tab 320 is shown generally covering the top surface 312 of the battery 310 and includes a slit or opening 326 to allow for swelling of the battery. In this example, the battery 310 may be rounded and the EMI shield tab 320 extends circumferentially around battery 310. EMI shield tab 320 further includes a flared portion F that extends upwards and away from the top surface 312 of the battery 310 and the remainder of the body of the EMI shield tab 320.

A battery tab 330 may also be provided on the battery 310 and attached to a node of the battery. Battery tab 330 may be an elongated metal strip that extends from the top surface 312 of the battery 310 and along the edge surface 315 of the battery 310. Battery tab 330 may be positioned within the opening of the EMI shield tab 320 so as to provide for a positive interconnection with the external device.

The EMI shield tab 320 can further function as an electrical interconnection between the battery 310 and the MLB 306. In one example, EMI shield tab 320 can function as an anode tab that provides an electrical connection from the battery 310 to another device, such as the MLB 306. Use of the EMI shield tab 320 as an electrical interconnection can eliminate the need to include a separate or independent anode battery tab that takes up additional space within the wearable audio device. When the EMI shield tab 320 is joined to an anode, battery tab 30 can be joined to the cathode. This results in a negative interconnection between the EMT shield tab 320 and battery, as well as a positive interconnection between the battery tab 30 and a component external to the battery 310.

Additionally, or alternatively EMI shield tab 320 can provide support for other components within the wearable audio device. For example, EMI shield tab 320 may fully or partially support a flexible circuit or sensors or other components necessary for the wearable audio device to function.

Use of the EMI shield tab 320 can yield improved audio quality for wearable audio devices. This integrated solution addresses the limited space within a wearable device, while providing effective noise reduction. In the example where the EMI shield tab has a thickness of 100 µm and is comprised of a MuMetal, testing has shown that the EMI shield tab according to aspects of the disclosure can contain the noise to less than 0 dB, which is lower than the hearing limit.

Figure 9:
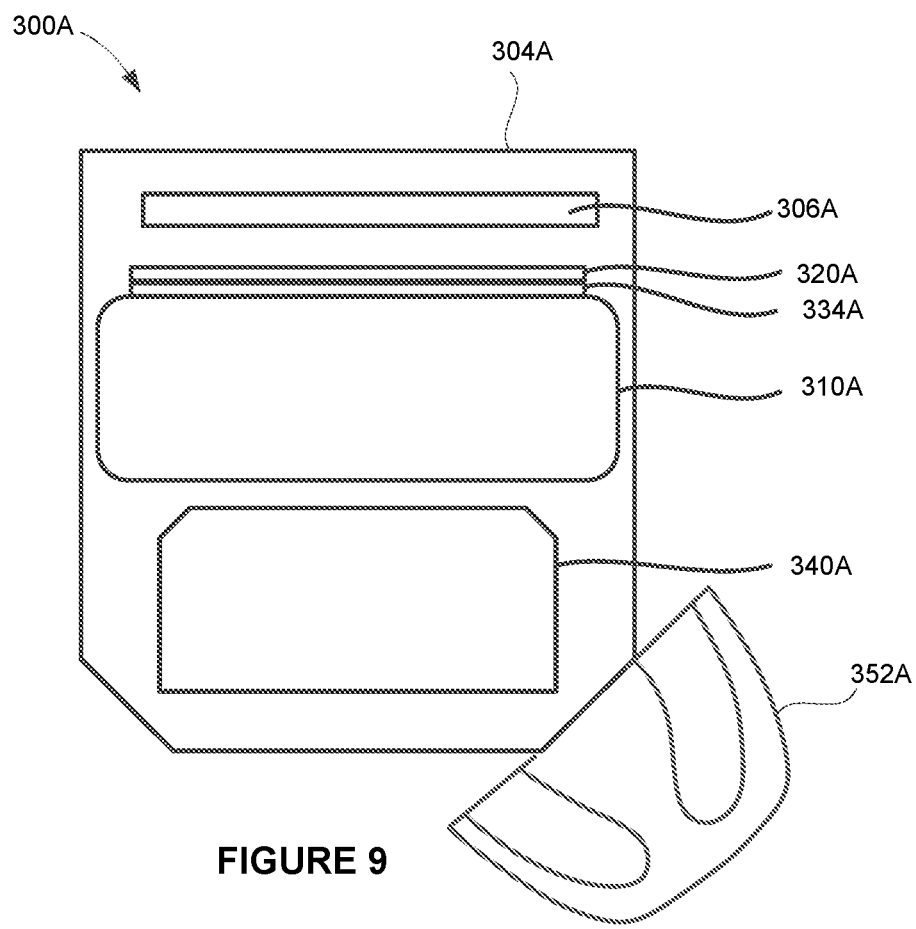
FIG. 9 is an enlarged view of the example battery and EMI shield tab of FIG. 3 according to an aspect of the disclosure; and, FIG. 10 is an enlarged view of the example battery and EMI shield tab of FIG. 3 according to an aspect of the disclosure.
Figure 10:
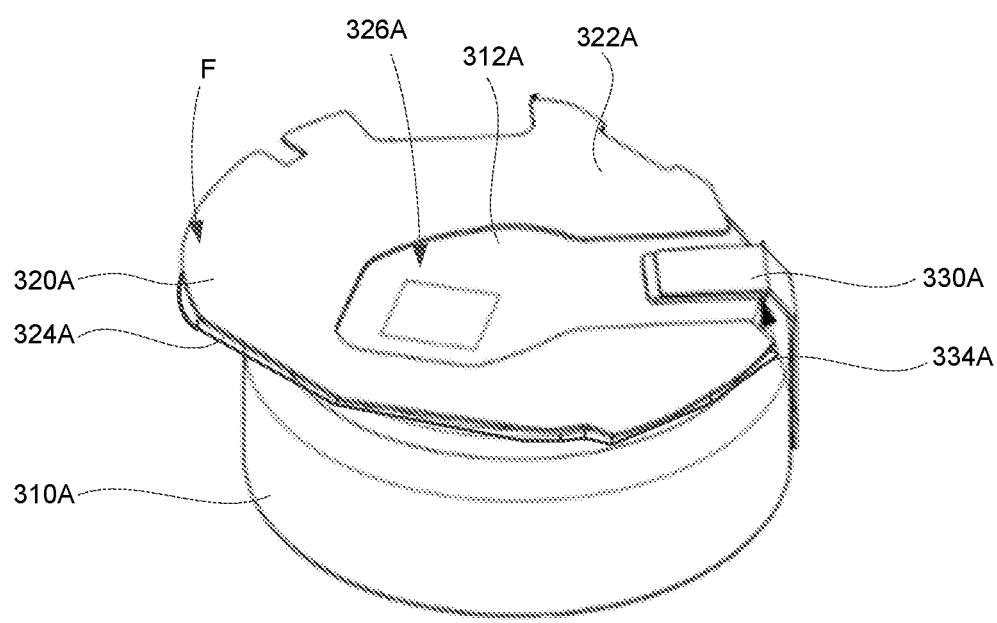

FIG. 9 is another example wearable audio device 300A which incorporates the use of an EMI shield tab coupled to a battery to provide for noise reduction. The wearable audio device 300A can include an outer housing 304A, a circuit board or MLB 306A, a speaker 340A, an earbud tip 352A, a battery 310A and an EMI shield, such as EMI shield tab 320A. This example is similar to FIG. 7, except that the wearable device has a first battery tab 334A and a second battery tab 330A attached to battery 310A by any suitable means, such as by welding. The first and second battery tabs 334A, 330A may be battery tabs that are commonly used to provide an electrical or conductive interconnection between the nodes of the battery 310A and an external device. The first and second battery tabs 334A, 330A may be formed from various metals, such as stainless steel. In this example, the first battery tab 334A may be an anode tab and the second battery tab 330A may be a cathode battery tab, but the reverse may be true in other examples.

The EMI shield tab 320A may be attached directly to the first battery tab 334 using various methods, not limited to welding or the use of mechanical fasteners. The EMI shield tab 320A is shown as a generally continuous planar metal sheet and in some examples can include an opening 326A. The opening is shown extending all the way through the top surface 322A and bottom surface 324A of the EMI shield tab 320A. As shown in the top view of FIG. 4, the EMI shield tab 320A may take on the same shape and size of the first battery tab 334A. In other examples, the EMI shield tab 320A may be comprised of multiple smaller tabs arranged adjacent one another or on top of one another and/or tabs that are sized or shaped differently than the first battery tab 334A.

As in the previous examples, the EMI shield tab 320A may be formed from a high magnetic flux permeable material, such as, for example, a metal or alloy, such as MuMetal or other alternatives, including those discussed herein. The EMI shield tab may have a relative permeability value ranging from 1000-300,000. In other examples, the relative permeability value of the coating may be less than 1000 or greater than 300,000. Further, the EMI shield tab 320A may have a thickness of 100 microns, but in other examples, the thickness of the EMI shield tab 320A may widely vary, as already discussed herein.

In other examples, and similar to the example discussed in FIGS. 5-6, the EMI shield tab 320A may instead be formed from a metal spray coat that is sprayed directly onto the first battery tab 334A.

According to an aspect of the disclosure, a wearable audio device sized to fit within an ear of an user comprises an outer housing; a circuit board positioned within the outer housing; a battery connected to the circuit board that has an anode and a cathode; a speaker adjacent the battery; and an electromagnetic interference ("EMI") shield tab coupled to the anode, wherein the EMI shield tab may be configured to shield the speaker from EMI generated by the circuit board and to provide an electrical interconnection to the anode, and wherein the EMI shield tab may be comprised of a high magnetic flux permeable metal material; and/or the EMI shield tab further comprises an opening that extends through a top surface and a bottom surface of the EMI shield and through which a top surface of the battery is exposed; and/or the EMT shield further comprises an opening that extends from an outer edge of the EMI shield tab to an interior portion of the EMI shield; and/or the EMI shield tab is attached to the anode by a welded connection; and/or the high magnetic flux permeable metal material comprises a MuMetal; and/or the EMI shield tab has a thickness ranging from 20 µm to 2000 µm; and/or the EMT shield tab has a thickness of 100 µm; and/or the EMT shield tab has a thickness greater than 20 µm;

the EMI shield has a thickness greater than 2000 µm;

the battery tab is attached to the anode and configured to provide an electrical interconnection between the anode and another component external to the battery, wherein the EMI shield tab overlies the battery tab; and/or the EMI shield tab is attached to the battery tab; and/or the EMI shield tab is comprised of a metallic coating that is disposed on at least one surface of the battery tab; and/or the EMT shield tab overlies only one surface of the battery; and/or a relative permeability value of the high magnetic flux permeable metal material ranges from 1000-300,000; and/or the EMI shield tab has a thickness greater than 20 µm; and/or the EMI shield tab has a thickness less than 20 µm; and/or the EMT shield has a thickness greater than 2000 µm; and/or the relative permeability value of the high magnetic flux permeable metal material is greater than 1000; and/or the relative permeability value of the high magnetic flux permeable metal material is greater than 300,000.

According to another aspect of the disclosure, a wearable audio device sized to fit within an ear of an user comprises an outer housing; a circuit board positioned within the outer housing; a battery electrically connected to the circuit board; an electromagnetic interference ("EMT") shield tab attached to the battery; and, an electronic component coupled to the circuit board, wherein the EMI shield tab may be comprised of a MuMetal and have an opening that extends therethrough, and wherein the EMT shield tab may be configured to shield the electronic component from EMI generated by the circuit board and to provide an electrical interconnection to the battery, and wherein the battery, the EMI shield tab, and the electronic component may be further positioned within the outer housing; and/or the EMI shield tab is positioned between the circuit board and the electronic component; and/or the battery further comprises an anode and a cathode, wherein the anode faces toward the circuit board; and/or the EMI shield tab is attached to the anode and positioned on a surface of the battery closest to the circuit board; and/or the opening extends through top and bottom surfaces of the EMI shield tab so as to expose a top surface of the battery; and/or the opening that extends from an outer edge of the EMI shield tab to an interior portion of the EMT shield; and/or the EMI shield tab has a thickness ranging from 20 µm to 2000 µm, and wherein the electronic component is a speaker; and/or the EMI shield tab is attached to the anode by a welded connection; and/or the EMI shield tab has a thickness ranging from 20 µm to 2000 µm; and/or the EMI shield tab has a thickness of 100 µm; and/or the EMI shield tab is comprised of a metallic coating that is disposed on at least one surface of the battery tab; and/or the EMI shield tab overlies only one surface of the battery; and/or a relative permeability value of the high magnetic flux permeable metal material ranges from 1000-300,000; and/or the EMI shield tab has a thickness greater than 20 µm; and/or the EMI shield has a thickness greater than 2000 µm; and/or the relative permeability value of the high magnetic flux permeable metal material is greater than 1000; and/or the relative permeability value of the high magnetic flux permeable metal material is greater than 300,000.

According to another aspect of the disclosure, a subassembly comprises a battery having an anode and a cathode; an electromagnetic interference ("EMI") shield tab attached to the anode; and a cathode battery tab coupled to the cathode, wherein the EMI shield tab may be comprised of a high magnetic flux permeable material, and wherein the EMI shield tab may be further configured to provide an electrical connection between the anode and a device external to the subassembly; and/or the EMI shield further comprises an opening that extends between a top and a bottom surface of the EMT shield tab and through which a top surface of the battery is exposed; and/or the opening extends from an outer edge of the EMI shield to an interior portion of the EMI shield; and/or the opening extends through top and bottom surfaces of the EMI shield tab so as to expose a top surface of the battery; and/or the opening that extends from an outer edge of the EMI shield tab to an interior portion of the EMI shield; and/or the EMI shield tab has a thickness ranging from 20 µm to 2000 µm, and wherein the electronic component is a speaker; and/or the EMT shield tab is attached to the anode by a welded connection; and/or the EMI shield tab has a thickness ranging from 20 µm to 2000 µm; and/or the EMI shield tab has a thickness of 100 µm; and/or the EMI shield tab is comprised of a metallic coating that is disposed on at least one surface of the battery tab; and/or the EMI shield tab overlies only one surface of the battery; and/or a relative permeability value of the high magnetic flux permeable metal material ranges from 1000-300,000; and/or the EMI shield tab overlies an anode battery tab attached to the anode; and/or the EMI shield tab is coated onto the anode battery tab attached to the anode, wherein the coating is a high magnetic flux permeable material; and/or the EMI shield tab has a thickness greater than 20 µm; and/or the EMI shield has a thickness greater than 2000 µm; and/or the relative permeability value of the high magnetic flux permeable metal material is greater than 1000; and/or the relative permeability value of the high magnetic flux permeable metal material is greater than 300,000; and/or a wearable device sized to fit within the ear of a user comprising an outer housing; a circuit board positioned within the outer housing; the subassembly; and a speaker adjacent the battery of the subassembly, wherein the EMI shield tab of the subassembly is configured to shield the speaker from EMI generated by the circuit board.

Unless otherwise stated, the foregoing alternative examples are not mutually exclusive, but may be implemented in various combinations to achieve unique advantages. As these and other variations and combinations of the features discussed above can be utilized without departing from the subject matter defined by the claims, the foregoing description should be taken by way of illustration rather than by way of limitation of the subject matter defined by the claims. In addition, the provision of the examples or embodiment described herein, as well as clauses phrased as "such as," "including" and the like, should not be interpreted as limiting the subject matter of the claims to the specific examples; rather, the examples are intended to illustrate only one of many possible implementations. Further, the same or similar reference numbers in different drawings can identify the same or similar elements.

The invention claimed is:

1. A wearable audio device sized to fit within an ear of an user, comprising:
    an outer housing;
    a circuit board positioned within the outer housing;
    a battery connected to the circuit board, the battery further comprising an anode and a cathode;
    a speaker adjacent the battery; and
    an electromagnetic interference ("EMI") shield tab coupled to the anode, the EMI shield tab configured to shield the speaker from EMI generated by the circuit board and to provide an electrical interconnection to the anode, the EMI shield tab comprised of a high magnetic flux permeable metal material.

2. The wearable audio device of claim 1, wherein the EMI shield further comprises an opening that extends through a top surface and a bottom surface of the EMI shield and through which a top surface of the battery is exposed.

3. The wearable audio device of claim 1, wherein the EMI shield further comprises an opening that extends from an outer edge of the EMI shield tab to an interior portion of the EMI shield.

4. The wearable audio device of claim 1, wherein the EMI shield tab is attached to the anode by a welded connection.

5. The wearable audio device of claim 1, wherein the high magnetic flux permeable metal material comprises a MuMetal.

6. The wearable audio device of claim 1, wherein the EMI shield tab has a thickness ranging from 20 µm to 2000 µm.

7. The wearable audio device of claim 6, wherein the EMI shield tab has a thickness of 100 µm.

8. The wearable audio device of claim 1, further comprising a battery tab attached to the anode and configured to provide an electrical interconnection between the anode and another component external to the battery, wherein the EMI shield tab overlies the battery tab.

9. The wearable audio device of claim 8, wherein the EMI shield tab is attached to the battery tab.

10. The wearable audio device of claim 8, wherein the EMI shield tab is comprised of a metallic coating that is disposed on at least one surface of the battery tab.

11. The wearable device of claim 1, wherein the EMI shield tab overlies only one surface of the battery.

12. The wearable audio device of claim 1, wherein a relative permeability value of the high magnetic flux permeable metal material ranges from 1000-300,000.

13. A wearable audio device sized to fit within an ear of an user, comprising:
an outer housing;
a circuit board positioned within the outer housing;
a battery electrically connected to the circuit board;
an electromagnetic interference ("EMI") shield tab attached to the battery; and
an electronic component coupled to the circuit board,
the EMI shield tab may be comprised of a MuMetal and have an opening extending therethrough, the EMI shield tab configured to shield the electronic component from EMI generated by the circuit board and to provide an electrical interconnection to the battery,
wherein the battery, the EMI shield tab, and the electronic component are further positioned within the outer housing.

14. The wearable audio device of claim 13, wherein the EMI shield tab is positioned between the circuit board and the electronic component.

15. The wearable device of claim 14, wherein the battery further comprises an anode and a cathode, wherein the anode faces toward the circuit board, and the EMI shield tab is attached to the anode and positioned on a surface of the battery closest to the circuit board.

16. The wearable device of claim 15, wherein the opening extends through top and bottom surfaces of the EMI shield tab so as to expose a top surface of the battery.

17. The wearable audio device of claim 16, wherein the EMI shield tab has a thickness ranging from 20 µm to 2000 µm, and wherein the electronic component is a speaker.

18. A subassembly comprising:
a battery having an anode and a cathode;
a cathode battery tab coupled to the cathode; and
an electromagnetic interference ("EMI") shield tab attached to the anode, the EMI shield tab configured to provide an electrical connection between the anode and a device external to the subassembly, the EMI shield tab comprising:
a high magnetic flux permeable metal material; and
an opening that extends between a top and a bottom surface of the EMI shield tab and through which a top surface of the battery is exposed.

19. The subassembly of claim 18, wherein the opening extends from an outer edge of the EMI shield to an interior portion of the EMI shield.

* * * * *